United States Patent
Yu et al.

(10) Patent No.: US 6,780,789 B1
(45) Date of Patent: Aug. 24, 2004

(54) LASER THERMAL OXIDATION TO FORM ULTRA-THIN GATE OXIDE

(75) Inventors: Bin Yu, Cupertino, CA (US); Robert B. Ogle, San Jose, CA (US); Eric N. Paton, Morgan Hill, CA (US); Cyrus E. Tabery, Cupertino, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 25 days.

(21) Appl. No.: 10/230,198

(22) Filed: Aug. 29, 2002

(51) Int. Cl.[7] .................... H01L 21/31; H01L 21/469
(52) U.S. Cl. ........................... 438/764; 438/770
(58) Field of Search ........................... 438/764, 765, 438/766, 768, 769, 770, 771, 772, 795

(56) References Cited

U.S. PATENT DOCUMENTS

| | | | | |
|---|---|---|---|---|
| 5,962,870 A | * | 10/1999 | Yamazaki et al. | 257/66 |
| 6,077,758 A | * | 6/2000 | Zhang et al. | 438/486 |
| 6,645,853 B1 | * | 11/2003 | Ngo et al. | 438/637 |
| 6,664,187 B1 | * | 12/2003 | Ngo et al. | 438/687 |

* cited by examiner

*Primary Examiner*—David Nhu

(57) ABSTRACT

Ultra-thin gate oxides are formed by exposing the upper surface of a substrate to a pulsed laser light beam in an atmosphere containing oxygen. Embodiments include exposing a silicon substrate to a pulsed laser light beam at a radiant fluence of 0.1 to 0.8 joules/cm$^2$ for 1 to 10 nanoseconds to form a gate oxide layer having a thickness of 3 Å to 8 Å, e.g., 3 Å to 5 Å.

7 Claims, 2 Drawing Sheets

LASER THERMAL OXIDATION TO FORM ULTRA-THIN GATE OXIDE

FIELD OF THE INVENTION

The present invention relates to a method of manufacturing semiconductor devices with accurately formed submicron features. The present invention has particular applicability in manufacturing high density semiconductor devices with transistors comprising ultra-thin gate oxides.

BACKGROUND ART

As microminiaturization proceeds apace, it becomes necessary to reduce the dimensions of transistors and, hence, the thickness of the gate oxide layers. However, conventional practices of forming a gate oxide layer, typically on a substrate comprising monocrystalline silicon, comprise thermal annealing, which does not enable the formation of ultra-thin gate oxide layers having a thickness less than about 10 Å with reliability and uniformity. Conventional thermal oxidation techniques result in gate oxide layers having a thickness greater than 10 Å, which is about 2.5 atomic layers, due to the inability to control the thermal budget during thermal annealing. Further, such thermally formed gate oxide layers are uneven and difficult to reproduce with any appreciable degree of consistency.

Accordingly, there exists a need for methodology enabling the fabrication of semiconductor devices comprising ultra-thin, uniform and reproducible gate oxide layers.

DISCLOSURE OF THE INVENTION

An advantage of the present invention is a method of manufacturing a semiconductor device having an ultra-thin, uniform and reproducible gate oxide layer.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: exposing an upper surface of a substrate to a laser light beam in an atmosphere containing oxygen to form a gate oxide layer thereon having a thickness of 3 Å to 8 Å; forming a gate electrode layer on the gate oxide layer, and patterning to form a gate electrode and gate oxide thereunder.

Embodiments of the present invention include exposing the upper surface of a monocrystalline silicon substrate to a pulsed laser light beam at a radiant fluence of 0.1 to 0.8 joules/cm$^2$ for about 1 to 10 nanoseconds, thereby elevating the temperature of the upper surface of the substrate to 1,100° C. to 1,250° C. and forming a gate oxide layer having a thickness of 3 Å to 5 Å.

Additional advantages of the present invention will be readily apparent to those skilled in the art from the following detailed description wherein the embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 and 2, similar features are denoted by similar reference characters.

DESCRIPTION OF THE INVENTION

The present invention addresses and solves the problem of forming uniform, ultra-thin, gate oxide layers, as at a thickness of 3 Å to 8 Å, e.g., 3 Å to 5 Å, with reproducibility. Conventional thermal oxidation techniques have not proven adequate to form reliable, uniform ultra-thin gate oxide layers with high reproducibility because of the difficulty in maintaining the thermal budget.

The present invention addresses and solves that problem by strategically exposing the upper surface of a substrate to a laser light beam in an atmosphere containing oxygen. The use of a laser light beam enables an extremely rapid heating and cooling cycle, thereby controlling the thermal budget and enabling the formation of an ultra-thin gate oxide layer with high uniformity and reproducibility. Further, the use of a laser light beam enables pin-point accuracy in targeting specific areas of the surface of the substrate, thereby avoiding unnecessarily elevating the temperature of other portions of the wafer causing various problems, such as defects and diffusion issues.

In accordance with embodiments of the present invention, the upper surface of a monocrystalline silicon substrate is exposed to a pulsed laser light beam at a radiant fluence of 0.1 to 0.8 joules/cm$^2$ for a brief period of time, such as 1 to 10 nanoseconds, in an atmosphere containing oxygen. During laser exposure, the upper surface of the substrate is briefly heated to a temperature of 1,100° C. to 1,250° C., during which oxidation is effected followed by rapid quenching. The restrictive thermal budget enables accurate formation of uniform ultra-thin gate oxide layers, such as at a thickness of 3 Å to 8 Å, e.g., 3 Å to 5 Å, with high uniformity, reproducibility and quality.

In implementing embodiments of the present invention, any of various commercially available laser tools may be employed, such as those utilizing a laser source capable of operating at energies of about 10 to about 2,000 mJ/cm$^2$/pulse, e.g., about 100 to 400 mJ/cm$^2$/pulse. Commercially available tools exist which can perform such laser annealing, either with or without a mask. The Verdant Technologies laser anneal tool is but an example and operates at an exposure wavelength of 308 nm.

Figure 1:
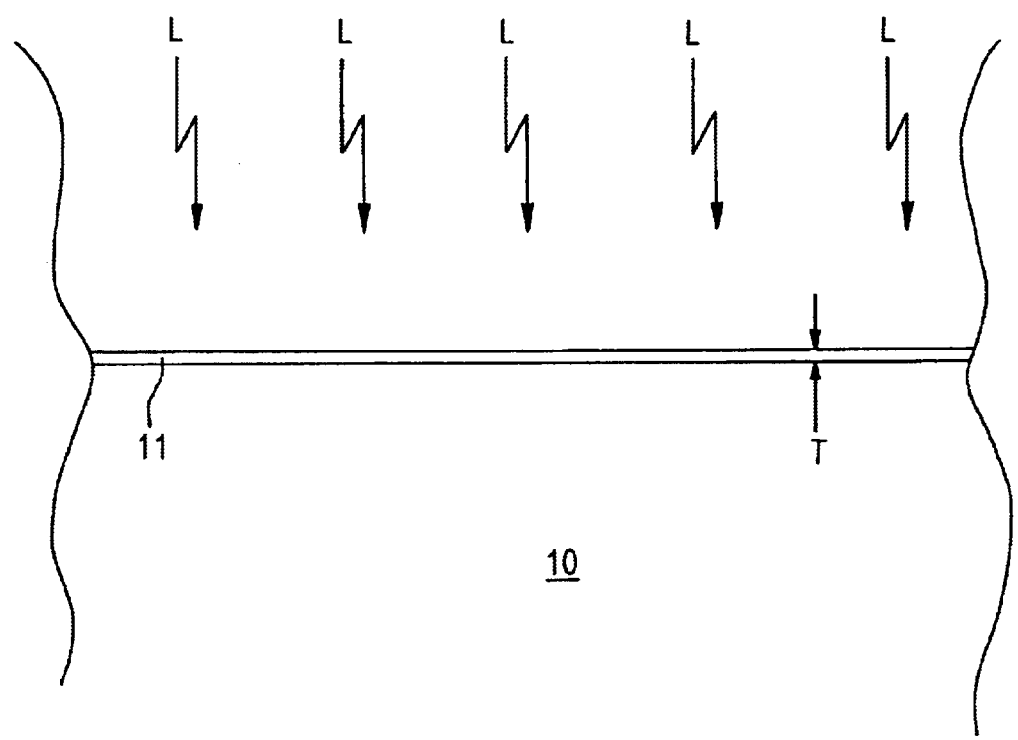
FIGS. 1 and 2 schematically illustrated sequential phases of a method in accordance with an embodiment of the present invention.
Figure 2:
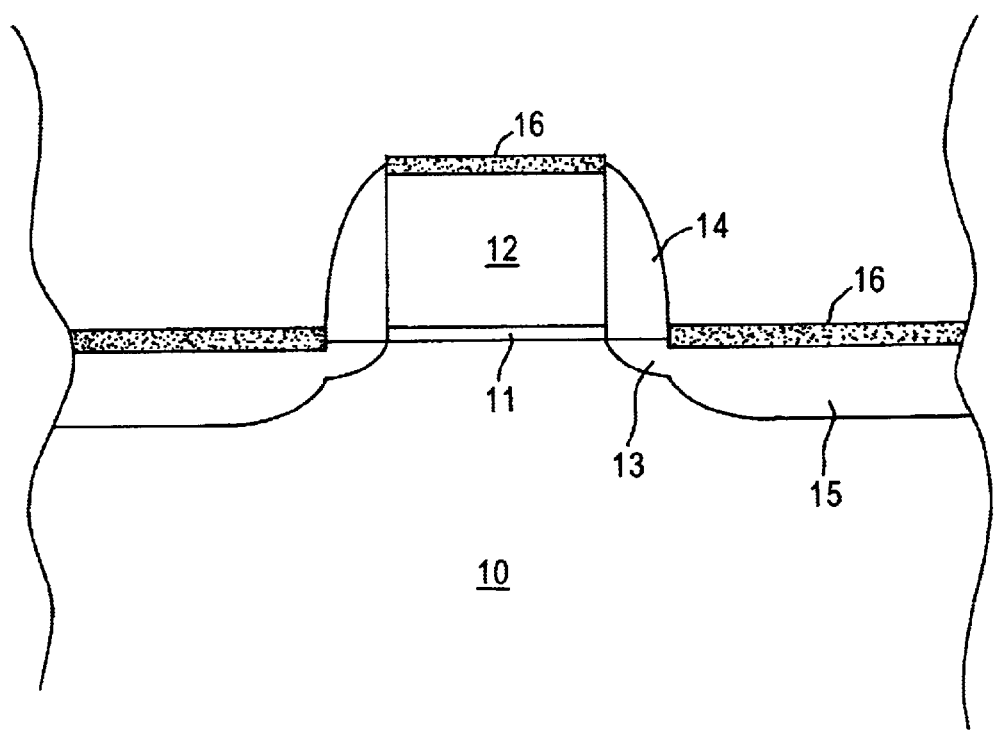

A method in accordance with embodiment of the present invention is schematically illustrated in FIGS. 1 and 2. Adverting to FIG. 1, a pulsed laser light beam, illustrated by arrows L, are impinged on a section of an upper surface of a monocrystalline silicon substrate 10 for 1 to 10 nanoseconds in an atmosphere containing oxygen, to form an ultra-thin silicon oxide layer 11 having a thickness (T) of 3 Å to 8 Å, e.g., 5 Å. The use of a pulsed laser light beam and attendant restricted thermal budget enables rapid heating and rapid cooling, thereby forming a highly reliable gate oxide layer 11 with high uniformity, quality and reproducibility.

Subsequent processing, as illustrated in FIG. 2, proceeds in accordance with conventional techniques by forming a doped polycrystalline layer over the gate oxide layer 11, and patterning to form gate electrode 12 over gate oxide 11. Shallow source drain regions 13 are then formed. Subsequently, dielectric sidewall spacers 14 are formed followed by forming source/drain regions 15. Silicidation is then implemented to form low resistance metal silicide layers 16 on the source/drain regions and upper surface of the gate electrode 12.

The strategic use of laser thermal oxidation enables the formation of highly reliable ultra-thin gate oxides with high uniformity and high reproducibility, consistent with the drive toward increased miniaturization. The present invention enjoys industrial applicability in fabricating various types of highly miniaturized semiconductor devices with improved reliability and reproducibility. The present invention has particular applicability in fabricating semiconductor device with design features in the deep submicron regime, as with a design rule of about 0.12 micron and under, with significant improved reliability and improved manufacturing throughput.

In the preceding detailed description, the present invention is described with reference to specific exemplary embodiments thereof. It will, however, be evident that various modifications and changes may be made thereto, without departing from the broader scope of the present invention, as set forth in the claims. The specification and drawings are, accordingly, to be regarded as illustrative and not as restrictive. It is understood that the present invention is capable of using various other combinations and environments and is capable of changes or modifications within the scope of the inventive concept as expressed herein.

What is claimed is:

1. A method of manufacturing a semiconductor device, the method comprising:

exposing an upper surface of a substrate to a laser light beam in an atmosphere containing oxygen to form a gate oxide layer thereon having a thickness of 3 Å to 8 Å;

forming a gate electrode layer on the gate oxide layer; and patterning to form a gate electrode and a gate oxide thereunder.

2. The method according to claim 1, wherein:

the substrate comprises monocrystalline silicon;

the gate electrode comprises doped polycrystalline silicon; and the gate oxide comprises silicon oxide.

3. The method according to claim 1, comprising forming the gate oxide layer at a thickness of 3 Å to 5 Å.

4. The method according to claim 1, comprising exposing the upper surface of the substrate to a pulsed laser light beam at a radiant fluence of 0.1 to 0.8 joules/cm$^2$ to form the gate oxide layer.

5. The method according to claim 4, comprising exposing the upper surface of the substrate to the pulsed laser light beam for 1 to 10 nanoseconds to form the gate oxide layer.

6. Exposing the upper surface of the substrate to the pulsed laser light beam to elevate the temperature of the upper surface of the substrate to 1,100° C. to 1,250° C.

7. A method of manufacturing a semiconductor device, the method comprising:

exposing an upper surface of a silicon substrate to a pulsed laser light beam at a radiant fluence of 0.1 to 0.8 joules/cm$^2$ for about 1 to about 10 nanoseconds in an atmosphere of oxygen, thereby elevating the upper surface of the substrate to a temperature of 1,100° C. to 1,250° C. and forming a gate oxide layer thereon having a thickness of 3 Å to 8 Å;

forming a gate electrode layer comprising doped polycrystalline silicon on the gate oxide layer; and patterning to form a gate electrode and gate oxide thereunder.

* * * * *